United States Patent [19]

Kariya et al.

[11] 3,714,467

[45] Jan. 30, 1973

[54] CHOPPER CIRCUIT

[75] Inventors: Shizuo Kariya; Hiroshi Narita; Takashi Tuboi, all of Katsuta; Tetsuya Takahashi, Hitachi, all of Japan

[73] Assignee: Hitachi, Ltd., Tokyo, Japan

[22] Filed: March 29, 1971

[21] Appl. No.: 128,722

[30] Foreign Application Priority Data

March 27, 1970 Japan ........................45/25280

[52] U.S. Cl. ...........307/240, 307/252 M, 307/252 A

[51] Int. Cl. ............................................H03k 17/56

[58] Field of Search...307/240, 252 K, 252 M, 252 A

[56] References Cited

UNITED STATES PATENTS 3,431,436 3/1969 King ..................................307/240 X 3,242,352 3/1966 Long..................................307/252 M 3,360,712 12/1967 Morgan..............................307/252 M

*Primary Examiner*—John Zazworsky

*Attorney*—Craig, Antonelli and Hill

[57] ABSTRACT

A chopper circuit comprising a first compound thyristor with a first series saturable reactor mainly for conducting load current and a commutation circuit storing the commutation energy for commutating the first thyristor by igniting a second thyristor, the construction of the junction in these two thyristors consisting of a thyristor included in this circuit with a second series saturable reactor region and a diode region in reverse parallel connection and one common junction and saturable reactors connected to said thyristors in series.

7 Claims, 17 Drawing Figures

INVENTORS
SHIZUO KARIYA, HIROSHI NARITA
TAKASHI TUBOI AND
BY TETSUYA TAKAHASHI
Craig, Antonelli, Stewart + Hill
ATTORNEYS INVENTORS
SHIZUO KARIYA, HIROSHI NARITA
TAKASHI TUBOI AND
TETSUYA TAKAHASHI
BY
Craig, Antonelli, Stewart & Hill
ATTORNEYS INVENTORS
SHIZUO KARIYA, HIROSHI NARITA,
TAKASHI TUBOI AND
TETSUYA TAKAHASHI
BY
Craig, Antonelli, Stewart & Hill
ATTORNEYS

INVENTORS
SHIZUO KARIYA, HIROSHI NARITA,
TAKASHI TUBOI AND
BY TETSUYA TAKAHASHI

Craig, Antonelli, Stewart & Hill
ATTORNEYS

CHOPPER CIRCUIT

BACKGROUND OF THE INVENTION

This invention relates to a chopper circuit using thyristors, especially a chopper circuit using a compound thyristor.

Generally, the operating frequency of a chopper is preferably a high frequency, because for intermittently controlling the current, the higher the operating frequency, the smaller will be the capacity of the circuit elements necessary for the chopper control. However, the operating frequency of the chopper is influenced by the turn-off time of the thyristor used in the chopper. In conventional thyristors, the turn-off time is at best about 50$\mu$ sec. However, the turn-off time of a recently proposed new type of thyristor is as small as 20$\mu$ sec., which contributes greatly to an increase in the speed of operation of the chopper. However, due to differences over conventional thyristors in the associated commutation mechanism required, the thyristor of the new type requires special circuit elements for its use.

SUMMARY OF THE INVENTION

An object of the present invention is to provide a chopper circuit which permits use of a new type of thyristor.

Another object of the invention is to improve the operating frequency of a chopper circuit, and to reduce the capacity of the associated circuit elements necessary for enhancing the operating frequency.

A further object of the invention is to accomplish the above objects by adding only a simple element to the chopper circuit.

An embodiment of the present invention is characterized by adding a voltage absorption means to said new type thyristor so as to facilitate the commutation of said thyristor. To said absorption means is added an instrument which controls the voltage absorption, so as to make said absorption means applicable to choppers utilizing different thyristors having a variety of turn-off times.

Further, several appropriate methods for inserting said means in accordance with the construction of a chopper circuit will be disclosed hereinafter.

DETAILED DESCRIPTION OF THE PREFERRED EMBODIMENTS

Before describing the various exemplary embodiments of the present invention, the thyristor employed by this invention will be explained. This thyristor, referred to herein as a compound thyristor, forms a diode with the central junction portion thereof in common with a conventional thyristor connected in parallel with opposite polarities, in the base integrally therewith. This compound thyristor thus operates to utilize the effect of drawing out the residing carriers in the central junction portion of the thyristor region, produced by the current flowing in the diode region, and thereby to speed up the thyristor operation. Such a high speed compound thyristor has the problem of an adverse effect in the switching of the thyristor region when the diode region recovers.

Next, a brief explanation of the action of an ordinary thyristor in commutation will be given to provide a basis for understanding the invention. When a forward current is applied to the thyristor and then an inverse voltage is applied to the circuit, excessive positive holes and electrons injected into the $n_B$ layer and $P_B$ layer by the forward current are drawn out respectively from the anode electrode A and the cathode electrode K, which at the same time begin to decay by recombination.

When the inverse voltage is applied, the injection of positive holes takes place from the $P_B$ layer to the $n_B$ layer in the central junction J2. At that time only a very small inverse electric current generally flows. In this way the excessive carriers gradually decay in the base portion. Junction J3 first recovers, followed by recovery of junction J1. After recovery of junction J1, the positive holes of the $n_B$ layer cannot flow outside and so they decay only by recombination. When the concentration of the positive holes is sufficiently lowered, the thyristor does not turn on even if a forward voltage is applied again. In other words, the thyristor has turned off.

However, in a compound thyristor which incorporates a thyristor with an inverse parallel diode, when the thyristor changes by addition of forward voltage to the diode from the state where forward current is flowing into the diode to the state where a forward voltage is applied to the thyristor, the thyristor sometimes turns on under the influence of the diode without a gate signal. This will be explained with reference to FIGS. 1*a* and 1*b*.

Figure 1A:
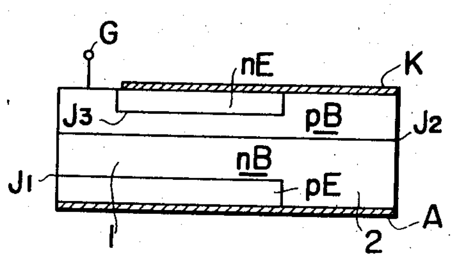
FIGS. 1*a* and 1*b* are views showing the construction of the new type thyristor used in the present invention.
Figure 1B:
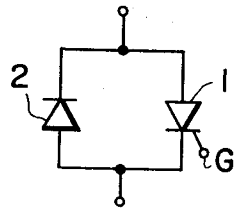

FIG. 1*a* is a view of the junction construction and FIG. 1*b* is an equivalent circuit diagram of the compound thyristor. In these figures, 1 denotes a thyristor consisting of an $n_E$ layer, and a $P_B$ layer, an $n_B$ layer and a second $P_E$ layer. Numeral 2 denotes a diode formed by the $P_B$ layer and the $n_B$ layer, which are base layers of thyristor 1, which diode is connected in reverse parallel relationship to the thyristor 1. A and K denote the anode electrode and the cathode electrode of the thyristor 1, respectively, and G denotes a gate electrode of the thyristor. Since junctions J1 and J3 are connected in short circuit in a compound element having such a junction construction, the current is not checked by recovery of the respective junctions and the drawing out of carriers continues until they are exhausted.

However, since the impedance of this element is very low in the inverse direction, considerable inverse current flows, and simultaneously positive holes are injected from the $P_B$ layer to the $n_B$ layer. Experiments show that the injection is generally more influential than the drawing effect of carriers at the time of commutation, and when the inverse current decreases at a high reduction ratio *di/dt*, the thyristor inconveniently turns on even when the voltage increases at a fairly small increment ratio *dv/dt* when the forward voltage is reapplied.

Thus, carriers injected in the diode region by the influence of the injection effect, especially those in the vicinity of the boundary between the diode and the thyristor are in quantity and remain in the vicinity of the central junction even when the forward voltage of the diode is reduced to zero and replaced by the inverse voltage. Before these carriers are recombined and decay, they are also dispersed to the thyristor region. They act similarly to a gate signal so as to cause the thyristor to turn on without a gate signal.

This phenomenon is apt to occur due to the fact that the higher the reduction ratio of current when the diode current is reduced, the higher the production ratio of residual carriers. Consequently, this phenomenon is apt to occur when a large current flows through the compound thyristor and/or, when turn-on and turn-off are effected for short periods. In the chopper circuit using an LC resonance circuit as a commutating device, the higher the control frequency, the larger is said reduction ratio *di/dt*. When the compound thyristor is used, it is subjected to the influence of the commutation of the diode, leading to the occurrence of the above phenomenon, thereby preventing chopper control. Thus, the compound thyristor has not been practically available for use in chopper circuits comprising conventional circuit elements.

As one of the solutions of this problem, it is conceivable to increase the number of elements in parallel for reducing the radio *di/dt* per element or to increase the number of elements in series so as to reduce the ratio *dv/dt*. However, such a method requires more thyristor elements in the conventional circuit. Hence, this method is undesirably expensive.

Another conceivable solution is to insert an ordinary air-core anode reactor in series with a thyristor. However, the value of the anode reactor, necessary for suppressing *di/dt* and *dv/dt* below the endurance limit is larger than the value of the commutation reactor of the chopper. This requires a longer time of commutation action of the chopper and does not permit the chopper to operate with high frequencies even with use of a thyristor which turns off for a short time.

Figure 2:
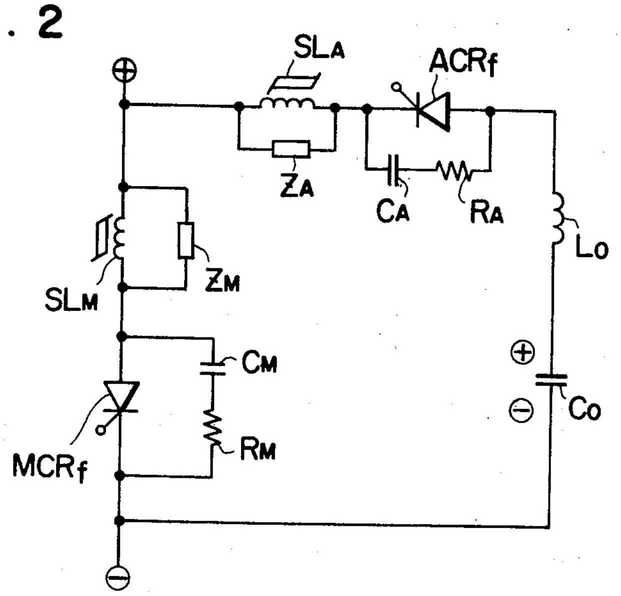
FIG. 2 shows a circuit diagram of an embodiment of the present invention.
Figures 3A, 3B, 3C, 3D, 3E, 3F, 3G:
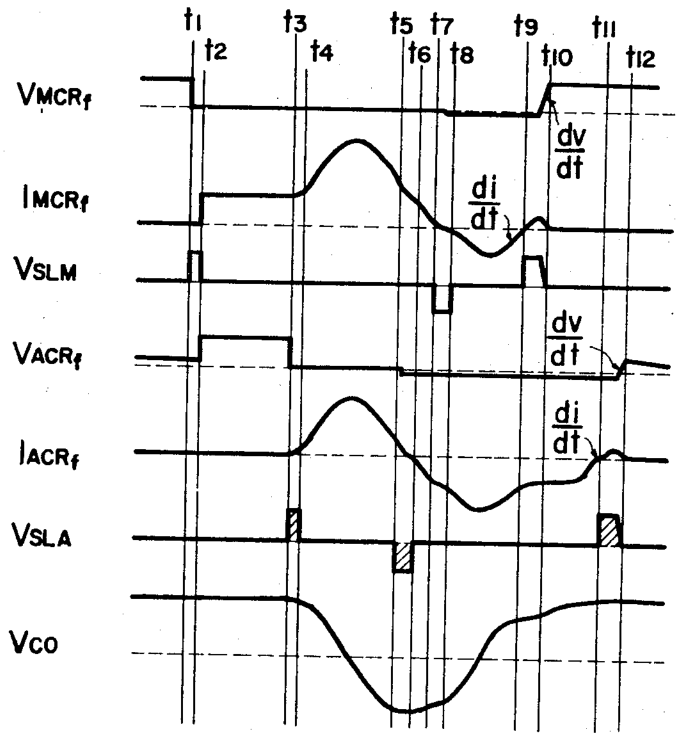
FIGS. 3*a* to 3*g* and FIG. 4 are views explaining the operation of the circuit shown in FIG. 2.

FIG. 2 shows an exemplary embodiment of the chopper circuit which employs a compound high speed thyristor. The circuit includes a first thyristor MCR*f* mainly charged with a load current, a second thyristor ACR*f*, a commutation reactor L*o*, a commutation condensor C*o*, a first saturable reactor SL*m* for the first thyristor, a second saturable reactor $SL_A$ for the second thyristor. A condenser C*m* and a resistor R*m* form a surge absorber for the first thyristor. A condensor $C_A$ and a resistor $R_A$ form a surge absorber for the second thyristor.

Additionally, in the drawings the first and the second thyristors MCR*f* and ACR*f* are marked similarly to prior thyristors, but it should be noted that each of the thyristors of the present invention contain a diode region which is in reverse parallel connection in the same base. Further, $Z_M$ and $Z_A$ denote impedance elements, herein considered resistors, respectively connected in parallel to the first and the second saturable reactors $SL_M$ and $SL_A$. Setting aside these impedance elements $Z_M$ and $Z_A$, the operations of the other elements will be explained as follows.

The operation of the circuit shown in FIG. 2 will be explained with reference to FIGS. 3*a* to 3*g*. First the commutation condenser C*o* is charged by the power source with the illustrated polarity. When the main thyristor MCR*f* is ignited at time *t*1 under this condition, the power source voltage is applied to the first saturable reactor $SL_M$ between time *t*1 and *t*2 as shown by $V_{SLM}$ of FIG. 3*c*. In this period of time the first thyristor MCR*f* is in full conductivity and the so-called switching power of the thyristor is suppressed down to the desired value.

Between times t2 and t3 after the saturable reactor $SL_M$ becomes positively saturated, load current ($I_{MCRf}$ in FIG. 3*b*) flows through the first thyristor MCR*f*. Next, in order to commutate this first thyristor MCR*f*, the second thyristor ACR*f* is ignited. At this time the voltage of the commutation condenser C*o* is also applied to the second saturable reactor $SL_A$ for a period between times *t*3 and *t*4 (FIG 3f) so as to suppress the switching power of the second thyristor ACR*f* down to the desired value. For a period between times *t*4 and *t*5 after the saturable reactor $SL_A$ becomes positively saturated, the commutation current determined by the commutation reactor L*o* and the commutation condenser C*o* (the second thyristor current $I_{ACRf}$ in FIG. 3*e*) flows through the first and second thyristors. For the period between times *t*5 and *t*6 wherein said inverse commutation current starts to flow, no current flows in the thyristor region of the second thyristor ACR*f*.

Then, the inverse voltage of the commutation condenser C*o* is applied to the saturable reactor $SL_A$ so as to lower its magnetic flux level from a positive saturation down to a negative saturation. From the time *t*6 when the saturable reactor $SL_A$ reaches negative saturation, a commutation current depending upon the commutation reactor L*o* and the condenser C*o* flows again so as to be equal to the load current at time *t*7. Namely the current $I_{MCRf}$ flowing through the first thyristor MCR*f* becomes zero. For the period between times *t*7 and *t*8, wherein the current $I_{MCRf}$ of the first thyristor MCR*f* is zero, the voltage of the commutation condenser C*o* is applied to the saturable reactor $SL_M$ from positive saturation to negative saturation. During this period of time *t*7 to *t*8, the thyristor region of the first thyristor MCR*f* becomes non-conductive.

From the time *t*8, when the saturable reactor $SL_M$ reaches negative saturation, the commutation current depending upon the commutation reactor L*o* and the condenser C*o* becomes larger than the load current, so that the commutation current continues to flow in the diode region of the first thyristor and becomes equal to the load current at time *t*9. Then there is no current in the diode region of the first thyristor MCR*f*. This causes the load current to flow through the negatively saturated saturable reactor $SL_A$ and the diode region of the second thyristor ACR*f*, thereby charging the commutation condenser Co again up to the source voltage with the illustrated polarity. On the other hand, in the diode region of the first thyristor some load current flows as a recovery current for said diode region. In said saturable reactor $SL_M$, the magnetic flux level is raised again from negative saturation nearly to positive saturation and the first thyristor MCR$f$ becomes completely non-conductive at the time $t$10 together with the thyristor region and the diode region. Between times $t$10 and $t$11 the aforementioned load current flows through the diode region of the second thyristor ACR$f$ so as to charge the commutation condenser Co. After the time $t$11 when said commutation condenser C$o$ into the diode recovery current flows from the commutation condenser C$o$ into the diode region of the second thyristor ACR$f$ so that the second thyristor ACR$f$ becomes completely non-conductive at time $t$12. Accordingly, between times $t$11 and $t$12 the magnetic level of the saturable reactor $SL_A$ is raised from negative saturation nearly to positive saturation. The chopper circuit of FIG. 2 is controlled in relationship with the above-mentioned wave form of operation and time.

As above mentioned, in a compound thyristor the reduction ratio $di/dt$ and the voltage increment ratio $dv/dt$ are desirably as small as possible when the diode region is in the recovered condition. Accordingly, for the chopper circuit in FIG. 2 it is desired that the current reduction ratio $di/dt$ and the voltage increment ratio $dv/dt$ be as small as possible in the periods between times $t$9 and $t$10 (FIG. 3) for recovery of the diode region of the first thyristor MCR$f$ and between times $t$11 and $t$12 (FIG. 3) for recovery of the diode region of the second thyristor ACR$f$.

In the present invention, which skillfully makes good use of the characteristic of the saturable reactor, the ratios $di/dt$ and $dv/dt$ in said diode region are suppressed to the necessary values at the time of recovery of said diode region. Namely as shown in FIG. 3, in the periods between times $t$9 and $t$10 and between times $t$11 and $t$12, wherein a voltage is applied to the saturable reactors, the exciting current depending upon the B-H characteristic of said saturable reactor is adapted to flow as a recovery current of the diode region so as to keep the ratio $di/dt$ below several A/$\mu$s (in absence of the saturable reactor, above several tens of A/$\mu$s), and the ratio $dv/dt$ below 200 v/$\mu$s by using a surge absorber ($C_m$, $C_A$ 0.5 ~ 2$\mu^F$ and $R_A$, $R_M$ 5 ~ 20 Ω).

This will be explained with reference to FIGS. 5$a$ and 5$b$. The characteristic shown in the upper portion of FIG. 5$a$ is a B-H characteristic of the ferrite core used by the inventors as a saturable reactor. In the characteristics shown in FIG. 5$b$, the dotted line shows the wave form of the voltage (corresponding to $t$9–$t$10 in FIG. 3$c$ or $t$11–$t$12 in FIG. 3$f$). The two-dot chain line shows the product of the electric voltage and time. Further, the characteristic shown in the lower portion of FIG. 5$a$ illustrates the exciting current of the saturable reactor in the same period of time.

Figure 5A:
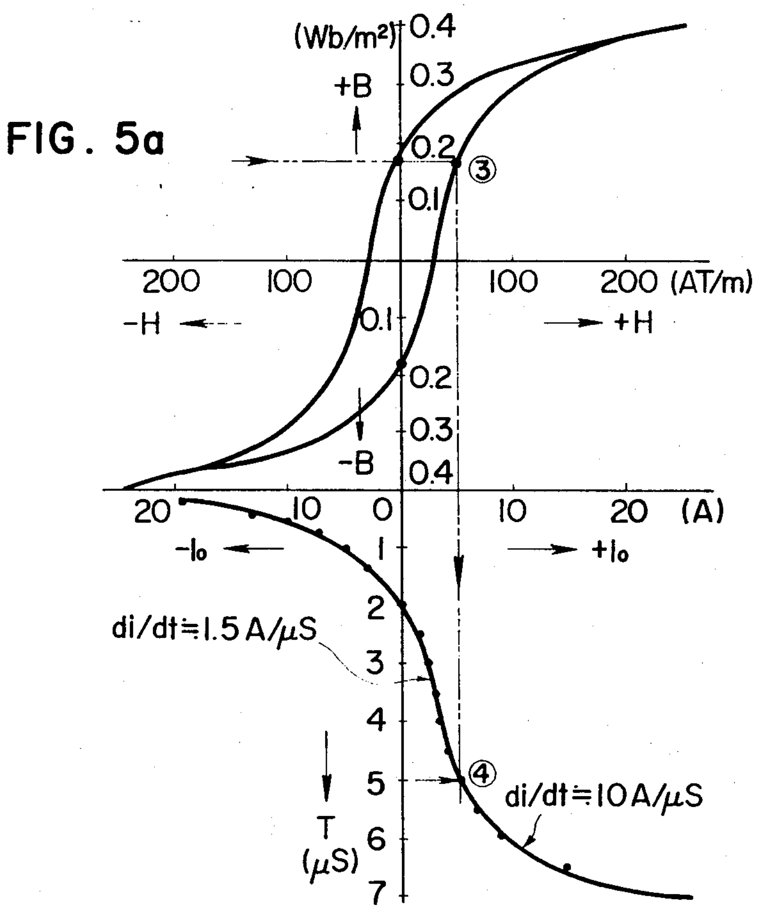
FIGS. 5*a* and 5*b* are views showing the characteristic of the saturable reactor used in the circuit of FIG. 2.

How to obtain the exciting current for example in the case of T=5$\mu$s after the voltage $E_S$ was applied will be described with reference to FIGS. 5$a$ and 5$b$. First draw upwardly a vertical line from the position T=5$\mu$s (Point 1) of the time abscissa of the characteristic shown in FIG. 5$b$. Draw a horizontal line from point 2 at which the vertical line intersects the two-dot chain line. Draw downwardly a vertical line from the point 3 at which said horizontal line intersects the characteristic (B-H characteristic) in the upper portion of FIG. 5$a$. The point 4 at which this vertical line intersects the horizontal line drawn from the time abscissa T=5$\mu$s of the characteristic in the lower portion of FIG. 5a shows the exciting current.

Figure 5B:
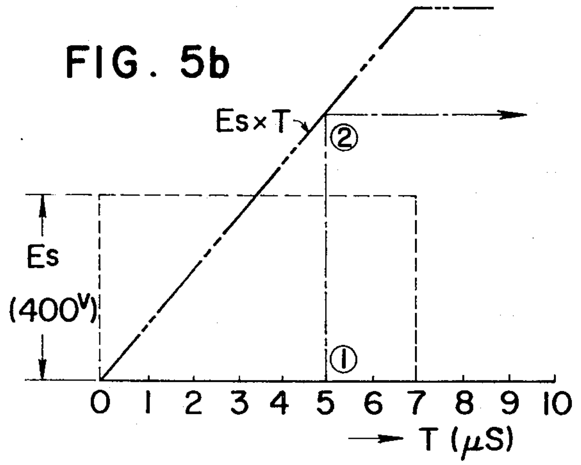

The exciting current corresponding to the time T=0 ~ 7$\mu$s on the time abscissa of the characteristic shown in FIG. 5$b$, which was obtained in the same way is shown in the lower portion of FIG. 5$a$. The specification of the iron core of the saturable reactor is as follows.

Sectional area A ≈ 35 × $10^{-4(m^2)}$

Magnetic path length $l$ ≈ 0.1 (m)

Further, in the exciting current characteristic in the lower portion of FIG. 5$a$, the area +$I_o$ shows the recovery current of the diode region in FIG. 3 ($I_{MCRf}$ in the period between the times $t$9 and $t$10 and $I_{ARCf}$ in the period between times $t$11 and $t$12.)

In the diode region, when the product of the recovery current and time reaches the value determined by the element, the endurance voltage is recovered. However if the saturable reactor is prevented from being saturated as long as said product increased to said value, $di/dt$, the ratio $dv/dt$ will be suppressed when the thyristor turns off. For example, if the average ratio $di/dt$ of recovery current is approximately 1.5A/$\mu$s as shown in the lower portion of FIG. 5$a$, or if the recovery in the diode region completely terminates in the vicinity of the exciting current I$o$ ≈ 15A, $di/dt$ is approximately 10A/$\mu$s. Hence $dv/dt$ at the time of diode recovery is approximately 50 ~ 200v/$\mu$s, taking resistance 5 ~ 20$^{\Omega}$ of the surge absorber into consideration.

Thus, the present invention has many advantages as follows. The switching power produced in turning on the thyristor can be suppressed by the actions of the saturable reactors connected in series, respectively, to the first thyristor MCR$f$ and the second thyristor ACR$f$, $di/dt$ can be suppressed to the desired values during recovery of the diode region when the thyristor turns off. Moreover, after the saturable reactor is saturated, it indicates little inductance and has little effect on the time of operation for commutation of the chopper. This advantageously permits the chopper to be controlled with high frequencies.

The inventors experiments indicate that the chopper circuit of the present invention could control the output voltage in a wide range of operating frequency of about 400 Hz when the compound thyristor elements of 1,500 V, 400 A and a turn-off time of 20$\mu$s, are employed. In contrast, the operating frequency of the conventional chopper is at most 200 Hz.

Now an explanation will be given of operations of impedance elements $Z_M$ and $Z_A$ provided in parallel to the two saturable reactors $SL_M$ and $SL_A$.

The saturable reactors $SL_M$ and $SL_A$ of the circuit shown in FIG. 2 operate to suppress the voltage increment ratio $dv/dt$ when the forward voltage of the compound thyristor is reapplied. This requires the saturable reactor to have a voltage absorption capacity more than that for the recovery time of the junction of the diode region built in the compound thyristor. (The period between times $t$9 and $t$10 relative to the first thyristor in $I_{MCRf}$ of FIG. 3$b$, and the period between times $t$11 and $t$12 relative to the second thyristor in $I_{ACRf}$ in FIG. 3$e$). To this end the saturable reactor should have a large product of the voltage and time.

This not only requires the saturable reactor to be excessively largeisized, but also reduces the effect in the chopper circuit which is intended to speed up operation.

As the above impedance elements $Z_M$ and $Z_A$, resistors or linear reactors are used. The equivalent B-H curves of the saturable reactors $SL_M$ and $SL_A$ shown in FIG. 4 relate to said resistors or linear reactors.

Figure 4:
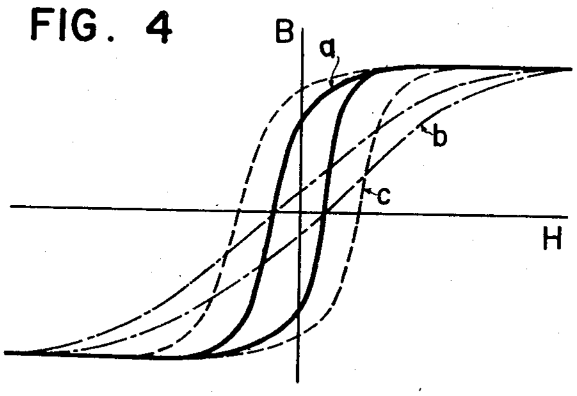

In the FIG. 4, curve *a* shows the B-H characteristic when only a saturable reactor is used, and curve *b* shows the B-H characteristic when a linear reactor is connected as an impedance element in parallel. Curve *c* shows the B-H characteristic when a resistor is used.

In either the curves *b* or *c*, the exciting magneto-motive force H for saturating the iron core apparently increases which accounts for the equivalent increase of current in the diode region at the time of recovery. By appropriately setting the value of the parallel impedance elements, the recovery time may be reduced and *di/dt* and *dv/dt* may also be suppressed to the desired values. In other words, the saturable reactor may be small-sized by appropriately selecting the values of the parallel impedance elements.

Further, when a ferrite core is used for the iron core of the saturable reactor, the coercive force of the core much depends on temperature. When only a saturable reactor is used, the recovery current and the recovery time will be directly influenced by a change in the coercive force. Therefore, there should be a good deal of margin in the design. However, since this impedance element leads the recovery current to be controlled by a parallel impedance of the stable characteristic, it is very advantageous in design.

Additionally, in the circuit shown in FIG. 2, the thyristor ACRf may have its polarity in the opposite direction. In such a circuit, the second thyristor ACR*f* is ignited so as to charge the commutation condenser C*o* with source voltage with the illustrated polarity. Next, the first thyristor MCR*f* is ignited to pass the load current, simultaneously reversing the charge voltage of the commutation condenser C*o* through the diode region of the second thyristor ACR*f*. Next, the second thyristor is ignited, thereby commutating the first thyristor MCR*f*. In this circuit, *di/dt* and *dv/dt* may also be suppressed to the desired values at the time of recovery of the diode region, similarly to the circuit shown in FIG. 2.

Figure 6:
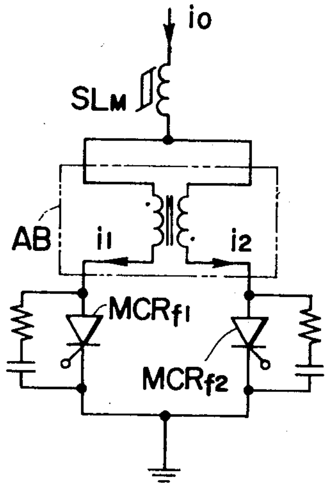
FIGS. 6 to 9 are explanatory views of another embodiment of the present invention and the operation of said embodiment.
Figure 7:
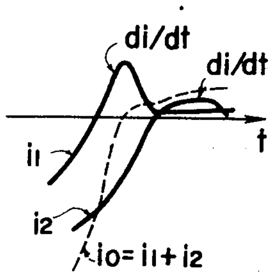
Figure 8:
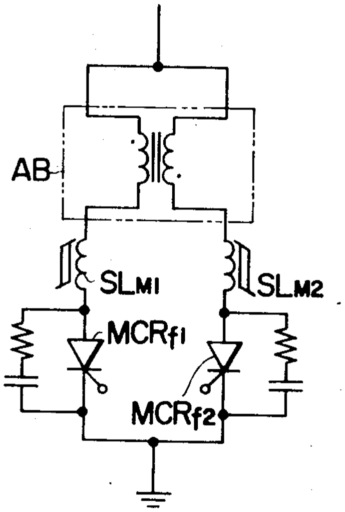

Next, in the case where such a chopper circuit is applied for controlling heavy current, a plurality of first thyristors may be connected in parallel. FIG. 6 shows two first thyristors MCR*f* connected in parallel. The saturable reactor $SL_M$ is placed in the common portion in the circuits of the first thyristors MCR*f* and MCR*f*2. When a current blancer AB inserted for balancing the current of the thyristor parallel connection has a sufficiently high precision, the exciting current of the saturable reactor $SL_M$, connected to the common portion is divided approximately in half so that *di/dt* is also divided approximately in half at the time of recovery of the diode portion. This advantageously ensures more positively the recovery of the diode region, i.e., the commutation of the compound type thyristor. Further, where the current balancer AB has a poor precision, and the current $i_1$ of the thyristor MCR$f_1$ is considerably different from the current $i_2$ of the thyristor MCR$f_2$, this results in a high *di/dt* at the time of recovery of the diode region of thyristor MCR$f_1$, as shown in FIG. 7, thereby causing the thyristor to automatically turn on so as not to permit the chopper to commutate. This failure may be prevented only by inserting the saturable reactors $SL_M$ into the thyristors MCR$f_1$ and MCR$f_2$ respectively in series, as shown in FIG. 8. In this way, since the saturable reactors $SL_{M1}$ and $SL_{M2}$ have the same B-H characteristic, they are not affected by current unbalance and the thyristors MCR$f_1$ and MCR$f_2$ positively commutate at *di/dt* and *dv/dt* depending upon the exciting current of saturable reactors $SL_{M1}$ and $SL_{M2}$.

Figure 9:
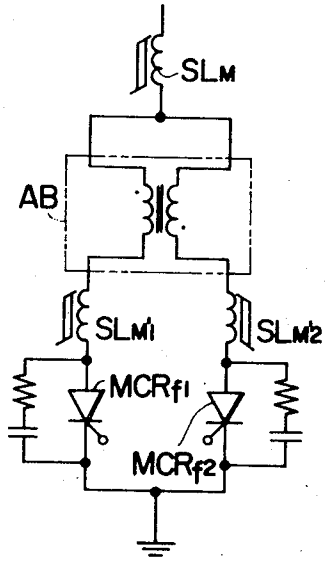

Further, since the current unbalance in FIG. 6 is caused by the voltage difference between the circuit of thyristor MCR$f_1$ and the circuit of the thyristor MCR*f*2, the current unbalance can be removed by inserting a saturable reactor nearly equivalent to that in FIG. 6 in the common place in the circuits of the thyristors MCR$f_1$ and MCR*f*2 and by inserting saturable reactors $SL_{M1'}$ and $SL_{M2'}$($SL_{M1} \gg SL_{M1'}$ and $SL_{M2} \gg SL_{M2'}$) into the thyristors, respectively, as shown in FIG. 9. These saturable reactors $SL_{M1}'$ and $SL_{M2}'$ only absorb the voltage difference which causes the above mentioned voltage unbalance so as to substantially equalize the currents of the respective thyristors. Accordingly, it may be said that the circuit shown in FIG. 9 consists of the circuits in FIG. 6 and FIG. 8 in combination.

Although the above described embodiments relating to FIGS. 6 to 9 provide for two parallel thyristors, the invention is also applicable to an arrangement having two more parallel thyristors. The invention is also applicable to thyristors using an anode reactor for balancing the current. Further although the described embodiments provide for use of a single thyristor, the invention is also applicable to a plurality of thyristors in series.

As above mentioned, the present invention which skillfully utilizes the characteristics of a saturable reactor, can thereby provide a chopper circuit with a high frequency using a compound thyristor. While the foregoing specification relates to several embodiments of the present invention, many variations thereof are conceivable without departing from the spirit of the appended claims.

What we claim is:

1. A chopper circuit comprising first compound thyristor means having a thyristor region and a diode region in reverse parallel connection as one body in which one of the junctions of the thyristor region comprising three junctions is extended to the diode region so as to function as a junction of the diode region; first saturable reactor means connected in series circuit with said first compound thyristor means; second compound thyristor means having the same structure as said first compound thyristor means and being connected to said first saturable reactor means; condenser means for commutating said first compound thyristor means by applying energy stored therein to the series circuit of said first compound thyristor means and said first saturable reactor means upon ignition of said second thyristor means; and second saturable reactor means connected in series with said second compound thyristor means.

2. A chopper circuit according to claim 1, wherein the time for saturating from one saturated value to the other in the first and second saturable reactor means is selected to be more than the time required to recover the diode region.

3. A chopper circuit according to claim 1, wherein said first and second saturable reactor means are respectively provided as parallel impedance means which increase the exciting magnetromotive force for saturating the cores.

4. A chopper circuit according to claim 3, wherein resistors having predetermined resistance value are used as said impedance means.

5. A chopper circuit according to claim 3, wherein nonsaturable reactors having a predetermined inductance value are used as said impedance means.

6. A chopper circuit according to claim 1, wherein said first compound thyristor means comprises plural compound thyristors connected in parallel and current balancer means for balancing the current of the respective thyristors, said first saturable reactor means being connected with the common connection point of said current balancer.

7. A chopper circuit according to claim 1, wherein said first compound thyristor means comprises plural compound thyristors connected in parallel and current balancer means for balancing the current of the respective thyristors, said first saturable reactor means being respectively inserted between said plural thyristors and said current balancer means.

* * * * *